United States Patent [19]

Cantarel

[11] Patent Number: 4,488,260
[45] Date of Patent: Dec. 11, 1984

[54] ASSOCIATIVE ACCESS-MEMORY

[75] Inventor: Pierre Cantarel, Heidelberg, Fed. Rep. of Germany

[73] Assignee: Brown, Boveri & Cie AG, Mannheim, Fed. Rep. of Germany

[21] Appl. No.: 348,280

[22] Filed: Feb. 12, 1982

[30] Foreign Application Priority Data

Feb. 14, 1981 [DE] Fed. Rep. of Germany ....... 3105503

[51] Int. Cl.³ ............................................. G11C 15/00
[52] U.S. Cl. .................................................... 365/49
[58] Field of Search .................. 365/49, 154, 219, 220

[56] References Cited

U.S. PATENT DOCUMENTS 3,388,382  6/1968  Lee ........................................ 365/49
3,761,902  9/1973  Weinberger .......................... 365/49

Primary Examiner—James W. Moffitt
Attorney, Agent, or Firm—Herbert L. Lerner; Laurence A. Greenberg

[57] ABSTRACT

Associative access-memory, including flip-flops as memory cells being disposed in a matrix having m rows and n columns and each having an input, an output and a dynamic input, each of the rows serving to accept an n-bit-wide memory word and to store m memory words, EXNOR members each being associated with one flip-flop and each having first and second inputs and an output, n memory inputs disposed in columns, the input of each flip-flop and the first input of the EXNOR member associated therewith being connected to a respective one of the n memory inputs, the output of each flip-flop being connected to the second input of the EXNOR member associated therewith, m memory inputs disposed in rows, the dynamic input of each flip-flop being connected to a respective one of the m memory inputs, m bus lines disposed in rows, the output of each EXNOR member being connected to a respective one of the bus lines, and voltage sources each being connected to one of the bus lines.

10 Claims, 3 Drawing Figures

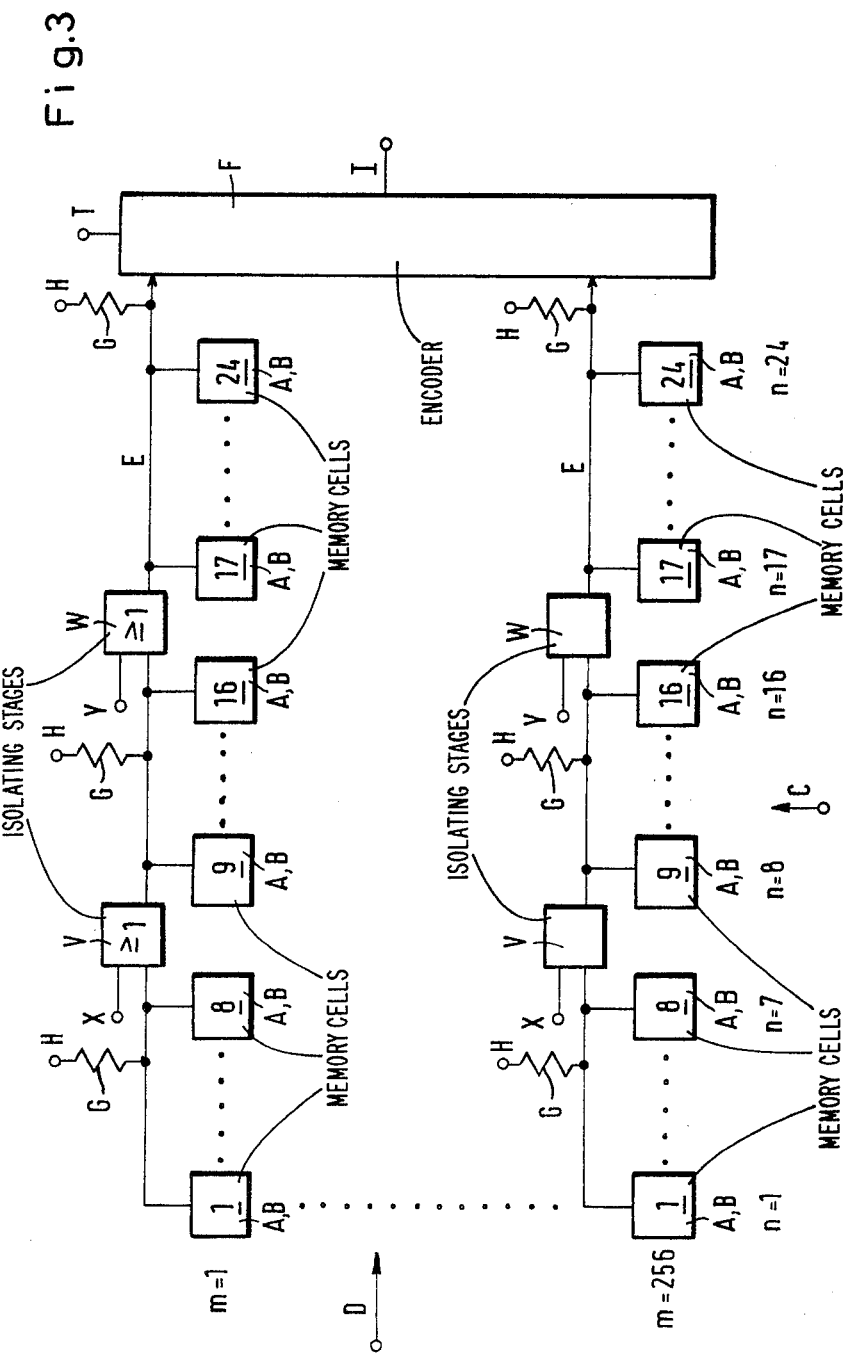

ASSOCIATIVE ACCESS-MEMORY

The invention relates to an associative access-memory with flip-flops as memory cells which are disposed in a matrix with m rows and n columns, wherein each of the rows serves for receiving an n-bitwide memory word and in which m memory words can be stored.

The concept, application and construction of associative memories are known, for instance, from the publication NTZ-Kurier 10/73, K 175 to K 183. Associative memories are understood in this context to be memories which are organized in such a way that the information is not stored therein by the statement of a memory address, but instead is stored through information regarding part of the information content. Although associative memories have definite advantages over conventionally addressed memories for certain limited applications, their concept is too elaborate for simpler applications, such as access memories, and they are too slow due to complicated searching processes.

It is accordingly an object of the invention to provide an associative access-memory which overcomes the hereinafore-mentioned disadvantages of the heretofore-known devices of this general type, and that provides matching which is as fast as possible between stored words and offered target words.

With the foregoing and other objects in view there is provided, in accordance with the invention, an associative access-memory, comprising flip-flops as memory cells being disposed in a matrix having m rows and n columns and each having an input, an output and a dynamic input, each of the rows serving to accept an n-bit-wide memory word and to store m memory words, EXNOR members each being associated with one flip-flop and each having first and second inputs and an output, n memory inputs disposed in columns, the input of each flip-flop and the first input of the EXNOR member associated therewith being connected to a respective one of the n memory inputs, the output of each flip-flop being connected to the second input of the EXNOR member associated therewith, m memory inputs disposed in rows, the dynamic input of each flip-flop being connected to a respective one of the m memory inputs, m bus lines disposed in rows, the output of each EXNOR member being connected to a respective one of the bus lines, and voltage sources each being connected to one of the bus lines.

The advantages that can be attained with the invention are in particular that the associative access-memory avoids a complete sequential search of the memory content and allows a fast search through parallel comparison over the entire bit width of the stored words. The access-memory is furthermore of simple construction.

In accordance with another feature of the invention, there are provided isolating stages dividing the bus lines into bus line sections, each of the isolating stages having a control input, and the voltage sources including a separate voltage source connected to each of the bus line sections.

In accordance with a further feature of the invention, there is provided an intermediate memory connected to the memory inputs disposed in columns, for entering a memory word to be stored or a target word.

In accordance with an added feature of the invention, there is provided a decoder connected to the memory inputs disposed in rows, for translating a memory address for the respective row.

In accordance with an additional feature of the invention, there is provided an encoder connected to the bus lines, for selecting the memory address.

In accordance with again another feature of the invention, there is provided an intermediate memory connected to the memory inputs disposed in columns, for entering a memory word to be stored or a target word, and an indicator output for the encoder, indicating coincidence between a written-in memory word and a target word being entered through the intermediate memory.

In accordance with again another feature of the invention, there is provided a buffer output for the encoder, and a buffer circuit connected to the buffer output of the encoder.

In accordance with again a further feature of the invention, there is provided an encoder connected to the bus lines, for selecting the memory address, an output for the encoder, a buffer circuit connected to the output of the encoder, and address inputs and outputs for the decoder and buffer circuit for entering and reading out memory addresses.

In accordance with again an added feature of the invention, there are provided control inputs for the buffer circuit for switching between reading and writing.

In accordance with a concomitant feature of the invention, there are provided operating inputs for the intermediate memory, for switching between word and byte-wise writing in.

Other features which are considered as characteristic for the invention are set forth in the appended claims.

Although the invention is illustrated and described herein as embodied in an associative access-memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 3 is another circuit diagram of an associative access-memory with separation or isolation stages.

Figure 1:
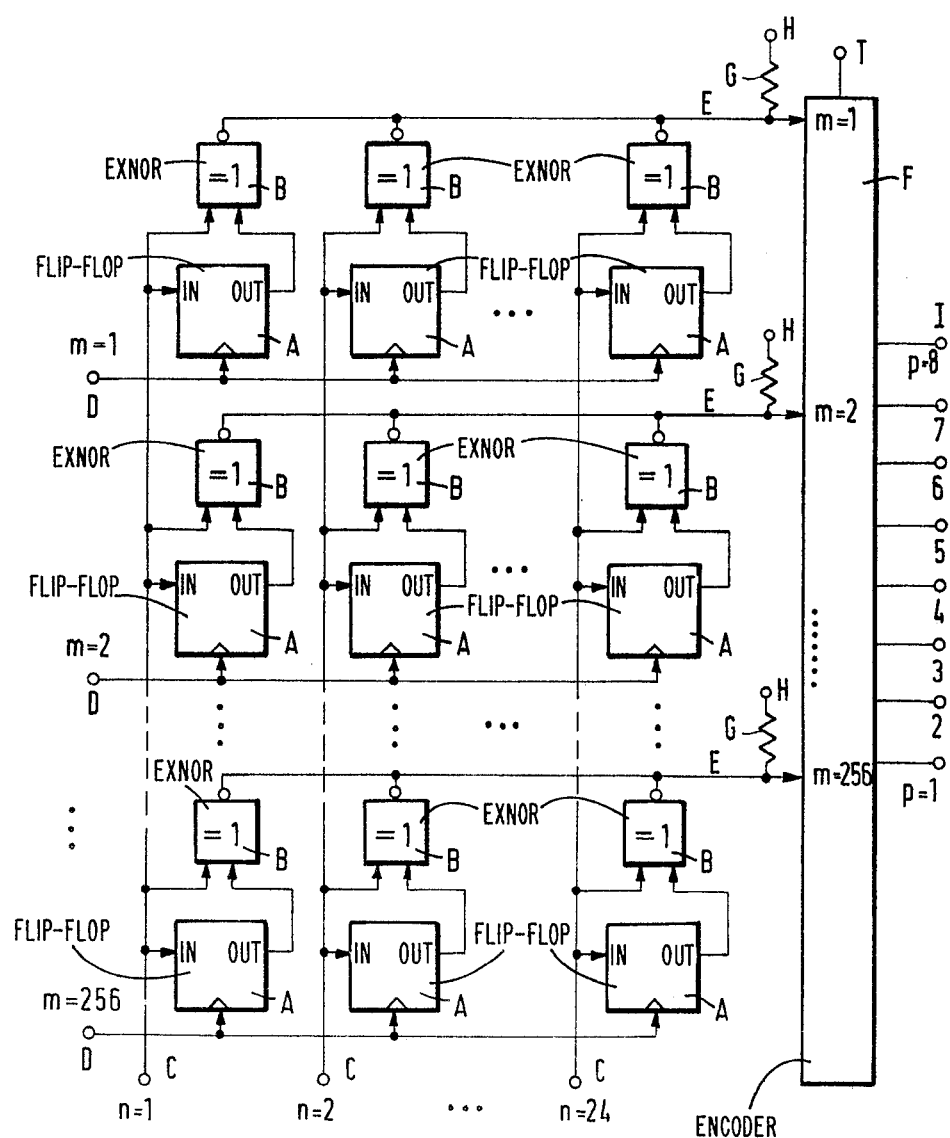
FIG. 1 is a schematic block circuit diagram of an associative access-memory.

Referring now to the figures of the drawing and first particularly to FIG. 1, thereof, there is seen an associative access-memory. In the embodiment example, the memory has a storage capacity of m=256 memory words (rows) with n=24 bits width (columns). The 256×24=6144 memory cells are formed by static flip-flops which are disposed in a matrix with m rows and n columns. With each flip-flop A, an Exclusive-OR member B with a negated output (EXNOR member) is associated. In detail, each flip-flop A is connected to one of the n=24 inputs C through its input "In". Each associated EXNOR member B is also connected on the input side thereof to the same respective input C. The output "Out" of each flip-flop A is connected to the second respective input of the associated EXNOR member B.

The dynamic inputs of the flip-flops A are connected to one of the m=256 inputs D.

The outputs of the EXNOR members B are connected to one of the m=256 bus lines E. The bus lines E are connected to an encoder F and are each connected through a resistor G to a positive voltage source H. The encoder F has p=8 outputs I as well as an indicator output T.

In the embodiment example, the inputs "In" of the 256 flip-flops A, as well as the 256 EXNOR members B, are connected to each of the 24 inputs C. The dynamic inputs of the 24 flip-flops A are connected to each of the 256 inputs D. Each of the 256 bus lines E is connected to the 24 EXNOR members B through the outputs of the EXNOR members B. There are 6144 flip-flops and EXNOR members, or 256 for each column.

Figure 2:
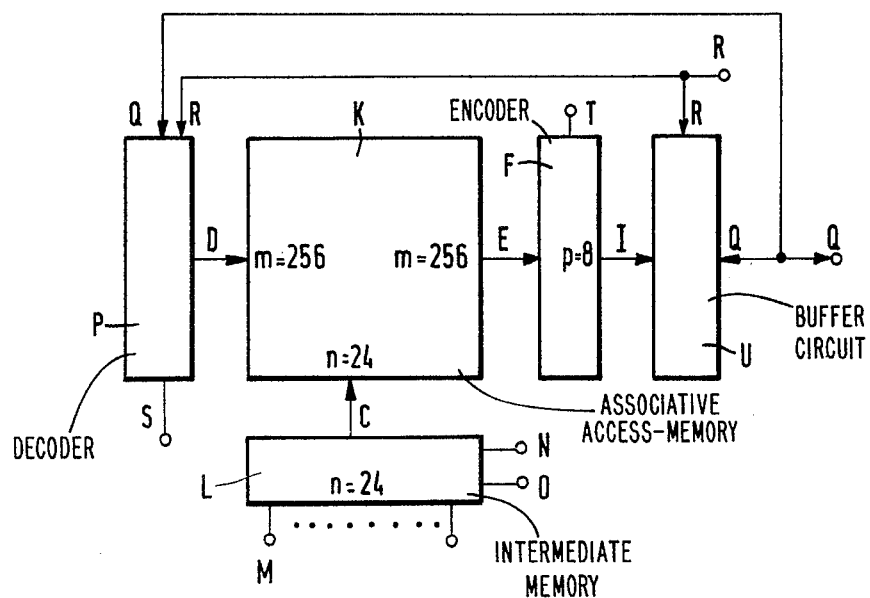
FIG. 2 is a circuit diagram of the external wiring of the associative access-memory.

In FIG. 2, the external wiring of the associative access-memory K is shown. The inputs C of the access-memory K are connected to an intermediate memory L. The intermediate memory L in turn has n=24 inputs M as well as two operating inputs N, O. The inputs D of the access-memory K are connected to a decoder P. The decoder has an address input Q as well as a control input R and a clock input S. The bus lines E of the access-memory K are connected to the encoder F. The encoder F has an indicating output T and is connected through p=8 outputs I to a buffer circuit U. The buffer circuit U likewise has a control input R as well as an address input or output Q.

The associative access-memory K which may be produced, for instance, in large scale integration, allows the parallel comparison of 24-bit words for a memory depth of 256 words, and therefore has 256×24=6144 effective memory cells. For parallel comparison, a target word 24-bits wide is fed through the inputs M, the intermediate memory L and the inputs C to the associative access-memory K. The temporarily stored target word is then compared in parallel with the words stored in the memory K. If, in the comparison, the signals present at the input "In" and the output "Out" of the flip-flop A agree, then the output signal of the associated EXNOR member B is "H" and otherwise the output signal is "L". The comparison between the target word and one of the 256 memory words stored in the memory K leads to a "hit" only if all 24 EXNOR members B associated with one word have the output signal "H". Then, a positive voltage is fed to the encoder F through the associated bus line E and a hit signal is indicated. The particular one of the bus lines E or the particular stored word that has lead to a "hit", is identified by the encoder F, translated into a memory address, 8-bits wide, associated with the stored word, and fed to the buffer circuit U through the outputs I. The buffer circuit U was already set for "read" at the beginning of the parallel comparison through the control input R. This allows for a free or independent switching of the address output Q. An address delivered by the encoder F to the buffer circuit U is thereby passed on to the address output Q.

Normally, the parallel comparison is broken off after a first coincidence between the target and the memory word and only the address of this first memory word is indicated, although other stored words may agree with the target word. However, the case is also conceivable in which the target word is not identical with any of the stored words. Then, the 8-bit wide address 000 000 00 is fed to the buffer circuit U after a complete comparison. Since, however, no hit is signalled at the indicating output T, it is evident that the address 000 000 00 has not also led to a coincidence between the target and the stored word.

Since the above-described function cycle for the function "read" has been explained, the cycle for the function "write" will be explained below. The buffer circuit U is separated from the encoder F by way of the control input R and the address of the word to be written is transmitted to the decoder P through the address input Q. The decoder P converts this address to one of the 256 inputs D and activates the corresponding flip-flops A through their dynamic inputs. This takes place after the word to be written-in itself has been transferred to the access memory K through the inputs M, the intermediate storage L and the inputs C.

The target words are stored in the associative access-memory so as to be either resident (ROM=Read Only Memory, PROM=Programmable Read Only Memory) or dynamic (RAM=Random Access Memory). In the loadable version, word-wise (24 bits) or byte-wise (8 bits) writing and comparison are possible. For switching between word-wise and byte-wise entry, the intermediate memory has two operating inputs N and O available. Furthermore, transfer of the information from the intermediate memory L to the access-memory K is possible by the multiplex method.

In FIG. 3, an associative access-memory with isolating stages V and W is shown. The construction of the access-memory as well as its external wiring, with the exception of the additionally provided isolating stages V with the inputs X and isolating stages W with inputs Y as well as their insertion into the bus lines, are as described in connection with FIGS. 1 and 2. The m=256 bus lines E are each interrupted at two points by the isolating stages V and W and more specifically, after the connection of the first eight EXNOR members B by the isolating stage V, and after the connection of the first sixteen EXNOR members by the isolating stage W. The bus lines E which are each divided by the isolating stages V and W into three sections, have a separate resistor G in each section, which is connected to a positive voltage source H.

If a signal is present at the input X of the isolating stage V, the isolating stage always delivers an "H" signal to the following bus-line section regardless whether the EXNOR members connected to the preceding bus-line section deliver an "L" or an "H" signal. The same applies to the isolating stages W which receive corresponding signals through their inputs Y. This has the result that if the isolating stage V is addressed, the first eight bits of a 24-bit-wide word are not used for the parallel comparison with the target word; if the isolating stage W is addressed, the first 16 bits of a 24-bit word are not used for the parallel comparison. In the first case mentioned, the target word may have a bit width of 16, and in the last case mentioned, a bit width of 8.

This embodiment of the associative access-memory with isolating stages is particularly well suited for the parallel comparison of large quantities of data. If the isolating stage V is addressed, up to $2^8 \cdot 256 = 65536$ memory words can be compared with a target word, where the first 8 bits of each 24-bit-wide word serves for addressing the respective data group, and the following 16 bits for the parallel comparison with the target word. In the cited example, a large quanity of data is divided into 256 data groups at 256 stored words each.

If the isolating stage W is addressed, up to $2^{16} \times 256 = 16,777,216$ memory words can be compared with a target word, where the first 16 bits of each 24-bit-wide word serve for addressing the respective data group, and the following 8 bits serve for the parallel comparison with a target word. In this example, the quantity of data is divided into 65,536 data groups at 256 memory words each.

There are claimed:

1. Associative access-memory, comprising flip-flops as memory cells being disposed in a matrix having m rows and n columns and each having an input, an output and a dynamic input, each of the rows serving to accept an n-bit-wide memory word and to store m memory words, EXNOR members each being associated with one flip-flop and each having first and second inputs and an output, n memory inputs disposed in columns, said input of each flip-flop and said first input of said EXNOR member associated therewith being connected to a respective one of said n memory inputs, said output of each flip-flop being connected to said second input of said EXNOR member associated therewith, m memory inputs disposed in rows, said dynamic input of each flip-flop being connected to a respective one of said m memory inputs, m bus lines disposed in rows, said output of each EXNOR member being connected to a respective one of said bus lines, and voltage sources each being connected to one of said bus lines.

2. Associative access-memory according to claim 1, including isolating stages dividing said bus lines into bus line sections, each of said isolating stages having a control input, and said voltage sources including a separate voltage source connected to each of said bus line sections.

3. Associative access-memory according to claim 1, including a decoder connected to said memory inputs disposed in rows, for translating a memory address for the respective row.

4. Associative access-memory according to claim 3, including an encoder connected to said bus lines, for selecting the memory address, an output for said encoder, a buffer circuit connected to said output of said encoder, and address inputs and outputs for said decoder and buffer circuit for entering and reading out memory addresses.

5. Associative access-memory according to claim 4, including control inputs for said buffer circuit for switching between reading and writing.

6. Associative access-memory according to claim 1, including an intermediate memory connected to said memory inputs disposed in columns, for entering a memory word to be stored or a target word.

7. Associative access-memory according to claim 1, including an encoder connected to said bus lines, for selecting the memory addresses.

8. Associative access-memory according to claim 7, including an intermediate memory connected to said memory inputs disposed in columns, for entering a memory word to be stored or a target word, and an indicator output for said encoder, indicating coincidence between a written-in memory word and a target word being entered through said intermediate memory.

9. Associative access-memory according to claim 7 or 8, including a buffer output for said encoder, and a buffer circuit connected to said buffer output of said encoder.

10. Associative access-memory according to claim 6 or 8, including operating inputs for said intermediate memory, for switching between word and byte-wise writing in.

* * * * *